(12) United States Patent
Zhou et al.

(10) Patent No.: US 11,215,953 B1
(45) Date of Patent: Jan. 4, 2022

(54) TIME TO DIGITAL CONVERTER

(71) Applicant: Shanghai Zhaoxin Semiconductor Co., Ltd., Shanghai (CN)

(72) Inventors: Yongqi Zhou, Beijing (CN); Xiaoguang Wang, Beijing (CN)

(73) Assignee: SHANGHAI ZHAOXIN SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 17/079,799

(22) Filed: Oct. 26, 2020

(30) Foreign Application Priority Data

Jun. 10, 2020 (CN) .......................... 202010521716.1

(51) Int. Cl.
*G04F 10/00* (2006.01)
*H03L 7/099* (2006.01)
*H03L 7/085* (2006.01)
*H03K 19/20* (2006.01)

(52) U.S. Cl.
CPC ............ *G04F 10/005* (2013.01); *H03L 7/085* (2013.01); *H03L 7/0995* (2013.01); *H03K 19/20* (2013.01)

(58) Field of Classification Search
CPC ..... G04F 10/005; H03L 7/085; H03L 7/0995; H03K 19/20
USPC ................................... 327/147–149, 156–158
See application file for complete search history.

(56) References Cited

U.S. PATENT DOCUMENTS

| | | | | |
|---|---|---|---|---|
| 9,369,139 B1* | 6/2016 | Chu | ...................... | H03L 7/0995 |
| 10,693,475 B1* | 6/2020 | Gong | ...................... | H03L 7/093 |
| 10,727,844 B1* | 7/2020 | Gong | ...................... | H03L 7/087 |
| 10,727,848 B2* | 7/2020 | Dato | ...................... | H03L 7/0994 |
| 10,819,355 B1* | 10/2020 | Abughazaleh | ........ | G04F 10/005 |
| 11,042,126 B2* | 6/2021 | Yuan | ...................... | G04F 10/005 |
| 2010/0214028 A1* | 8/2010 | Kobayashi | ................ | H03L 7/08 331/18 |
| 2011/0007859 A1* | 1/2011 | Ueda | ......................... | H03L 7/18 375/376 |
| 2011/0234327 A1* | 9/2011 | Kobayashi | .............. | H03L 7/085 331/1 R |
| 2012/0249198 A1* | 10/2012 | Sinha | ...................... | H03L 7/089 327/157 |
| 2013/0211758 A1* | 8/2013 | Prathapan | ............... | H03L 7/091 702/66 |
| 2015/0145570 A1* | 5/2015 | Perrott | .................. | G04F 10/005 327/157 |
| 2016/0182067 A1* | 6/2016 | Liu | ......................... | G04F 10/005 327/158 |

(Continued)

*Primary Examiner* — Adam D Houston

(74) *Attorney, Agent, or Firm* — McClure, Qualey & Rodack, LLP

(57) ABSTRACT

A time-to-digital convertor comprises a phase frequency detector, a first conversion module, a gated ring oscillator and a counting module. The phase frequency detector outputs a first detection signal and a second detection signal according to a first clock signal and a second clock signal. The first conversion module receives the first detection signal and the second detection signal to generate a first control signal and a second control signal. The gated ring oscillator receives the first and second control signals and outputs a plurality of clock signals according to the pulse width difference between the first and second control signals. The counting module counts the plurality of clock signals to generate the phase difference between the first and second clock signals.

17 Claims, 9 Drawing Sheets

(56) References Cited

U.S. PATENT DOCUMENTS

| | | | |
|---|---|---|---|
| 2017/0214513 A1* | 7/2017 | Asada | H04L 7/0337 |
| 2017/0373709 A1* | 12/2017 | Kondo | H03L 7/0891 |
| 2020/0012301 A1* | 1/2020 | Lee | G05F 1/575 |
| 2020/0195263 A1* | 6/2020 | Khoury | H03L 7/1974 |
| 2021/0006255 A1* | 1/2021 | Arisaka | H03L 7/0895 |

* cited by examiner

TIME TO DIGITAL CONVERTER

CROSS REFERENCE TO RELATED APPLICATIONS

This application claims priority to and the benefit of China Application No. 202010521716.1, filed on Jun. 10, 2020, the entirety of which is incorporated by reference herein.

FIELD OF THE INVENTION

The invention is related to a time-to-digital convertor, and it is especially related to a time-to-digital convertor comprising a dead zone elimination function and a wider phase input range.

DESCRIPTION OF THE RELATED ART

A time-to-digital convertor (TDC) is an important component of a digital phase-locked loop, it determines the practicality of the digital phase-locked loop. Generally, the time-to-digital convertor receives a reference clock signal and a feedback clock signal, and converts the phase relationship between the reference clock signal and the feedback clock signal into a corresponding digital signal, and outputs the corresponding digital signal to other modules of the digital phase-locked loop.

The time-to-digital converters may have many types of structures. The most common types of structures are the phase interpolation time-to-digital convertor (PI-based TDC), Vernier TDC, Multi-phases OSC TDC, etc. However, time-to-digital convertors with these types of structures cannot simultaneously take account of the requirements of phase measurement range, layout area, power consumption, and accuracy. Moreover, the TDC of these types of structures always need a large area, use a large amount of power, and have limited accuracy when measuring phase differences.

Therefore, there is a need for a time-to-digital convertor that may improve the range and accuracy of phase measurement, and reduce the layout area and power consumption.

BRIEF SUMMARY OF THE INVENTION

In order to resolve the issue described above, an embodiment of the invention provides a time-to-digital convertor. The time-to-digital convertor comprises a phase frequency detector, a first conversion module, a gated ring oscillator, and a counting module. The phase frequency detector receives a first clock signal and a second clock signal, and outputs a first detection signal and a second detection signal whose pulse width difference corresponds to the phase difference between the first clock signal and the second clock signal. The first conversion module is coupled to the phase frequency detector to receive the first detection signal and the second detection signal. The first conversion module selects one signal with a wider pulse width from the first detection signal and the second detection signal as a first control signal, and selects the other signal with a narrower pulse width from the first detection signal and the second detection signal as a second control signal. The gated ring oscillator is coupled to the first conversion module to receive the first control signal and the second control signal. The gated ring oscillator outputs a plurality of clock signals according to the pulse width difference between the first detection signal and the second detection signal. The counting module is coupled to the gated ring oscillator to receive the clock signals, and counts the clock signals to generate the phase difference between the first clock signal and the second clock signal.

An embodiment of the invention provides another time-to-digital convertor. The time-to-digital convertor comprises a phase frequency detector, a first gated ring oscillator, a second gated ring oscillator, a first counting module, a second counting module and a subtractor. The phase frequency detector receives a first clock signal and a second clock signal, and outputs a first detection signal and a second detection signal whose pulse width difference corresponds to the phase difference between the first clock signal and the second clock signal. The first gated ring oscillator is coupled to the phase frequency detector to receive the first detection signal, and outputs a plurality of first clock output signals according to the first detection signal. The second gated ring oscillator is coupled to the phase frequency detector to receive the second detection signal, and outputs a plurality of second clock output signals according to the second detection signal. The first counting module is coupled to the first gated ring oscillator to receive the plurality of first clock output signals, counts the plurality of first clock output signals, and outputs the pulse width of the first detection signal. The second counting module is coupled to the second grated ring oscillator to receive the plurality of second clock output signals, counts the plurality of second clock output signals, and outputs the pulse width of the second detection signal. The subtractor is coupled to the first counting module and the second counting module to receive the pulse width of the first detection signal and the pulse width of the second detection signal. The subtractor subtracts the pulse width of the second detection signal from the pulse width of the first detection signal. The subtractor outputs the phase difference between the first clock signal and the second clock signal.

BRIEF DESCRIPTION OF THE DRAWINGS

The invention can be more fully understood by reading the subsequent detailed description with references made to the accompanying figures. It should be understood that the figures are not drawn to scale in accordance with standard practice in the industry. The size of the components may be enlarged or reduced to provide clear illustration.

DETAILED DESCRIPTION OF THE INVENTION

Figure 1:
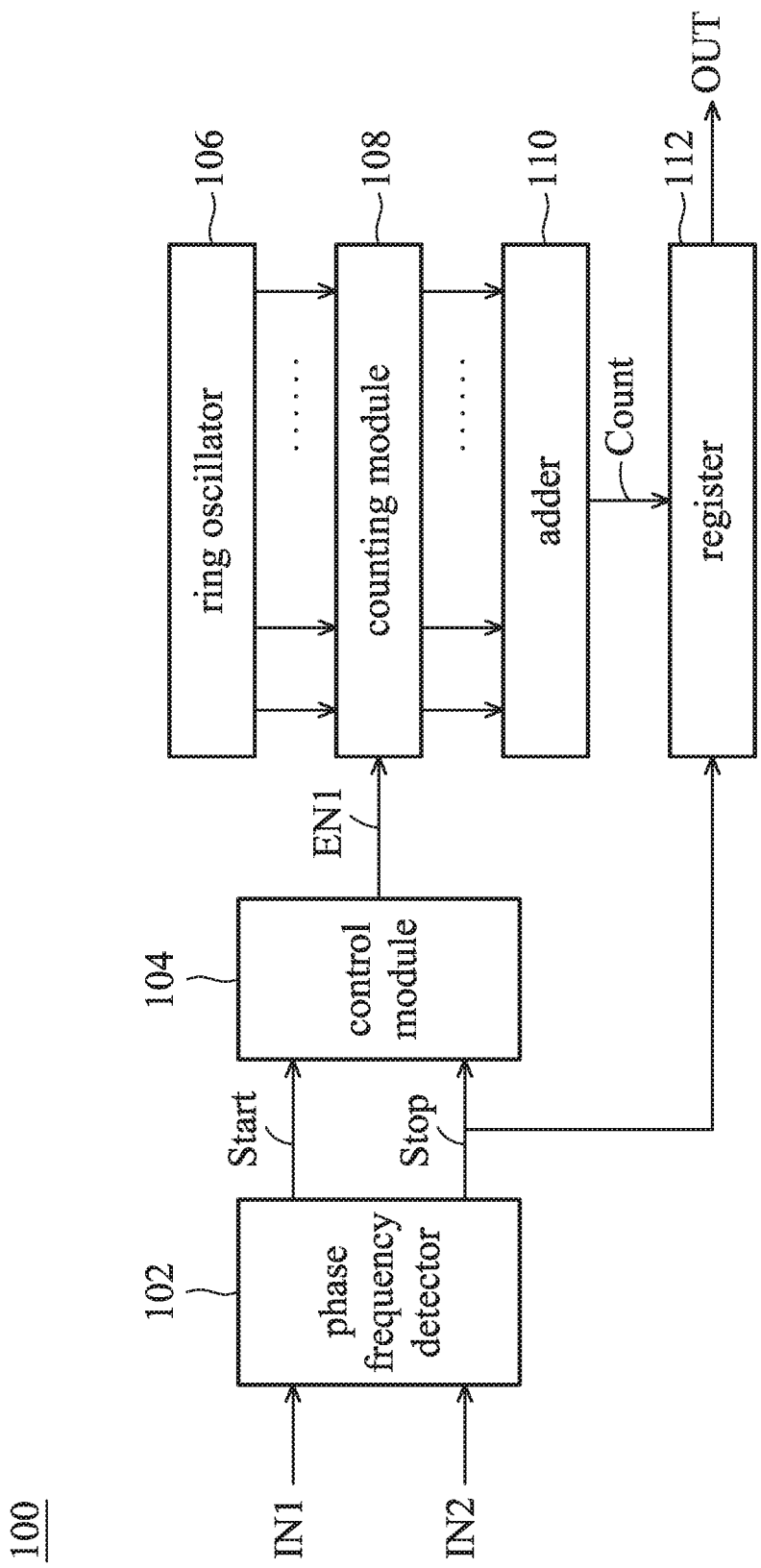
FIG. 1 is a schematic diagram of a time-to-digital convertor 100 in accordance with some embodiments of the disclosure.

FIG. 1 is a schematic diagram of a time-to-digital convertor 100 in accordance with some embodiments of the disclosure. As shown in FIG. 1, the time-to-digital convertor 100 includes a phase frequency detector 102, a control module 104, a ring oscillator 106, a counting module 108, an adder 110, and a register 112.

As shown in FIG. 1, the phase frequency detector 102 receives a first clock signal IN1 and a second clock signal IN2, and generates a start signal (Start) and a stop signal (Stop) according to the first clock signal IN1 and the second clock signal IN2. The control module 104 receives the start signal (Start) and the stop signal (Stop), and generates an enable signal EN1 according to the start signal (Start) and the stop signal (Stop). The ring oscillator 106 generates and outputs a plurality of clock signals. The counting module 108 is coupled to the control module 104 and the ring oscillator 106 to respectively receive the enable signal EN1 from the control module 104 and the clock signals from the ring oscillator 106. The counting module 108 includes a plurality of counters. Each of the counters counts the rising edges or pulses of a corresponding one of the clock signals output by the ring oscillator 106, and the counting module 108 outputs counting results accordingly.

The adder 110 is coupled to the counting module 108 to receive the counting results. The adder 110 sums the counting results to form a total count (Count). The register 112 is coupled to the adder 110 to receive the total count (Count). The register 112 further receives the stop signal (Stop). The register 112 controls the timing of receiving the total count (Count) and outputting a digital signal (Out) according to the stop signal (Stop).

The ring oscillator 106 shown in FIG. 1 is always in a state of oscillating and continuously outputting. The enable signal EN1 controls the counting module 108 to receive frequency signals output by the ring oscillator 106, herein the pulse width of the enable signal EN1 represents the phase difference between the first clock signal IN1 and the second clock signal IN2. The frequency signals are converted into a value (Count) corresponding to the phase difference between two clock signals by the adder 110 and output the value (Count) through the register 112 in a timely manner.

Figure 2:
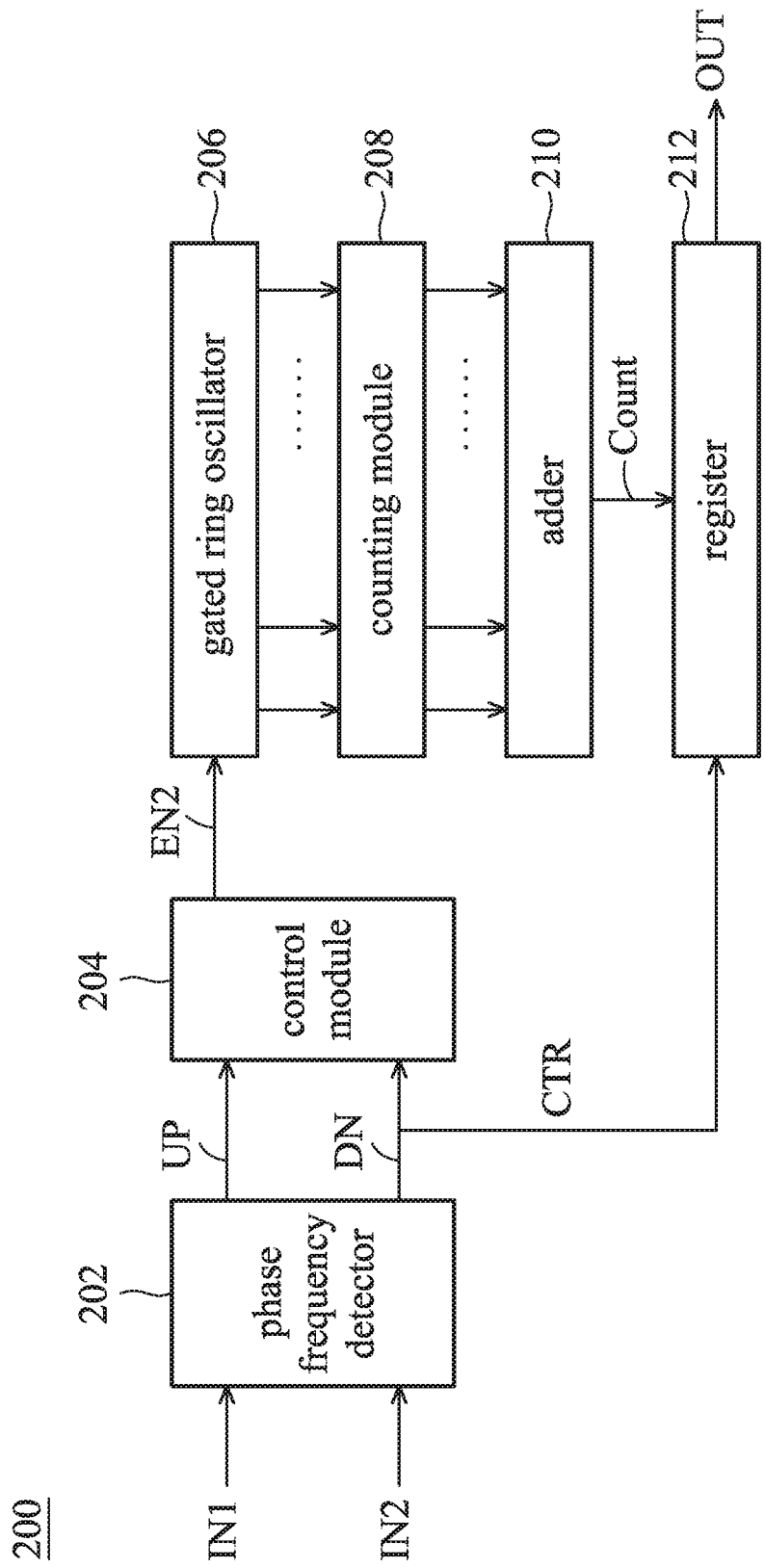
FIG. 2 is a schematic diagram of a time-to-digital convertor 200 in accordance with some embodiments of the disclosure.

FIG. 2 is a schematic diagram of a time-to-digital convertor 200 in accordance with some embodiments of the disclosure. As shown in FIG. 2, the time-to-digital convertor 200 includes a phase frequency detector 202, a control module 204, a gated ring oscillator 206, a counting module 208, an adder 208, and a register 212.

Different from the time-to-digital converter 100 shown in FIG. 1, the phase frequency detector 202 shown in FIG. 2 receives the first clock signal IN1 and the second clock signal IN2, and generates a first detection signal UP and a second detection signal DN according to the first clock signal IN1 and the second clock signal IN2. In some embodiments, the first detection signal UP and the second detection signal DN are different from the start signal (Start) and the stop signal (Stop). The first detection signal UP and the second detection signal DN are intermediate signals in the processing of the phase frequency detector 102 generating the start signal (Start) and the stop signal (Stop). It may also be considered that the start signal (Start) and the stop signal (Stop) are obtained after processing the first detection signal UP and the second detection signal DN. Therefore, compared with the phase frequency detector 102, the structure of the phase frequency detector 202 is more simplified.

Moreover, as shown in FIG. 2, the control module 204 is coupled to the phase frequency detector 202 to receive the first detection signal UP and the second detection signal DN output by the phase frequency detector 202. The control module 204 converts the first detection signal UP and the second detection signal DN to an enable signal EN2, herein the pulse width of the enable signal EN2 represents the phase difference between the first clock signal IN1 and the second clock signal IN2. The gated ring oscillator 206 receives the enable signal EN2. The enable signal EN2 controls the timing of generating a plurality of clock signals of the gated ring oscillator 206.

The timing of receiving the total count (Count) and outputting the digital signal (Out) of the register 212 is controlled by a control signal CTR, the control signal CTR is generated according to the first clock signal IN1 and the second clock signal IN2 by the phase frequency detector 202. The control signal CTR may be regarded as a clock signal generated by the phase frequency detector 202 according to another intermediate signal, the first detection signal UP and the second detection signal DN, herein the another intermediate signal is generated according to the first clock signal IN1 and the second clock signal IN2 by the phase frequency detector 202.

However, when the pulse width of the enable signal EN1 or EN2 is very small, for example, in the order of tens of picoseconds (ps). Due to the limitations of the time required for the counting module 108 to generate the count results, or the limitations of the time required for the rising edge or the falling edge of output signals of driving inverters (not shown) before or in the gated ring oscillator 206, the enable signal EN1 cannot timely control the timing of the counting module 108 of generating a phase difference corresponding to the first clock signal IN1 and the second clock signal IN2, and the enable signal EN2 cannot timely control the gated ring oscillator 206 to output the clock signals. Therefore, dead zones exist along a time axis (in the time domain) for the structure in FIG. 1 or FIG. 2. In dead zones, clock signals generated by the gated ring oscillator 106 cannot be counted, or the gated ring oscillator 206 cannot generate clock signals, so that the digital signal (Out), which is finally output by the time-to-digital convertor 100 or 200, is incorrect.

Figure 3:
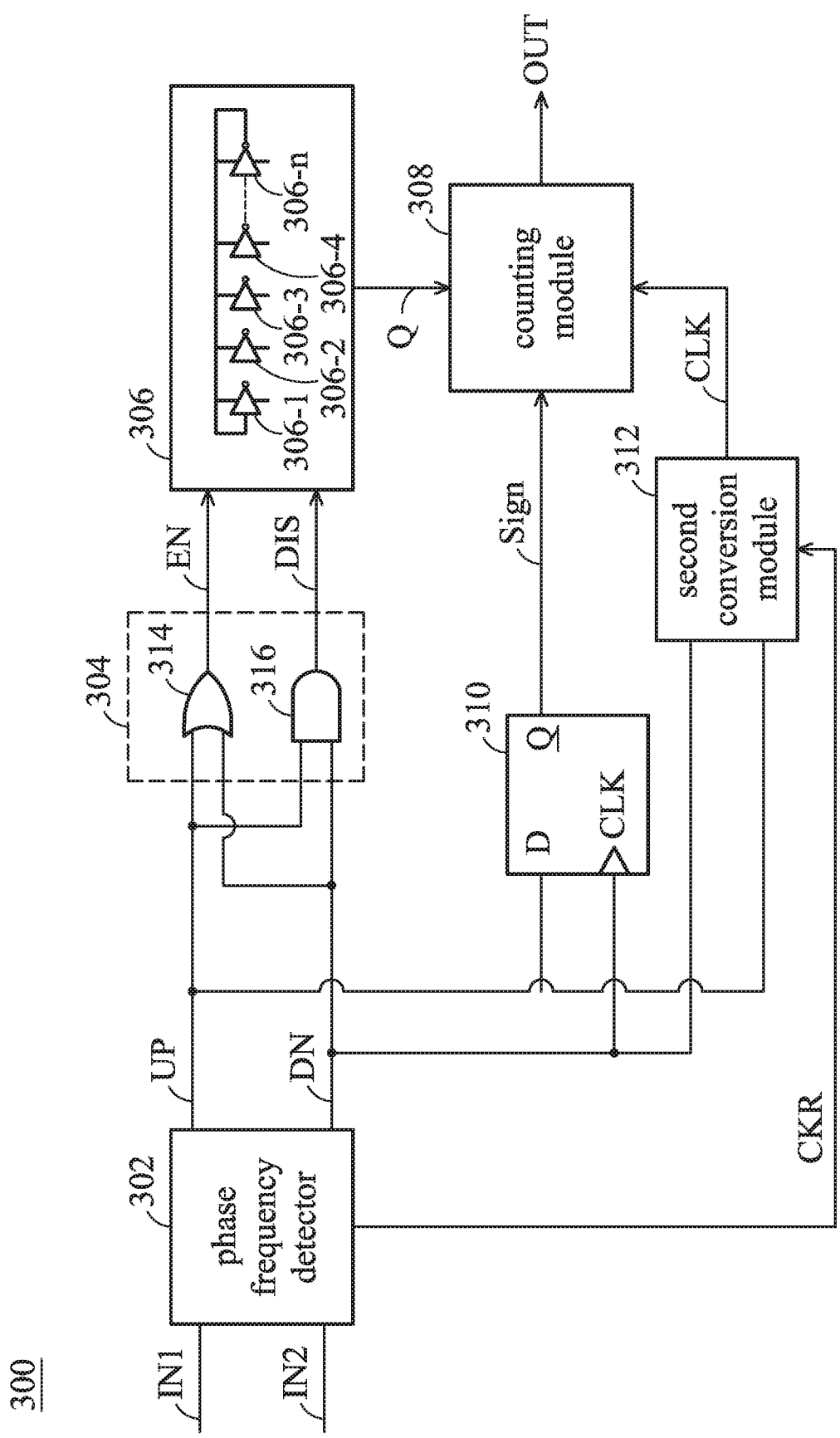
FIG. 3 is a schematic diagram of a time-to-digital convertor 300 in accordance with some embodiments of the disclosure.

FIG. 3 is a schematic diagram of a time-to-digital convertor 300 in accordance with some embodiments of the disclosure. As shown in FIG. 3, the time-to-digital convertor 300 includes a phase frequency detector 302, a first conversion module 304, a gated ring oscillator 306, a counting module 308, a D flip-flop 310, and a second conversion module 312.

As shown in FIG. 3, the phase frequency detector 302 receives the first clock signal IN1 and the second clock signal IN2, and generates the first detection signal UP and the second detection signal DN according to the first clock signal IN1 and the second clock signal IN2. The first conversion module 304 is coupled to the phase frequency detector 302 to receive the first detection signal UP and the second detection signal DN output by the phase frequency detector 302. The first conversion module 304 converts the first detection signal UP and the second detection signal DN to a first control signal EN and a second control signal DIS. The gated ring oscillator 306 is coupled to the first conversion module 304 to receive the first control signal EN and the second control signal DIS output by the first conversion module 304. The gated ring oscillator 306 outputs clock signals Q[1]~Q[n] under the control of the first control signal EN and the second control signal DIS, wherein n is a positive integer. The D flip-flop 310 is coupled to the phase frequency detector 302 to receive the first detection signal UP and the second detection signal DN output by the phase frequency detector 302. The D flip-flop 310 generates a sign bit (Sign) according to the first detection signal UP and the second detection signal DN. The second conversion module 312 is coupled to the phase frequency detector 302 to receive the first detection signal UP, the second detection signal DN, and an intermediate signal CKR output by the phase frequency detector 302. The second conversion module 312 converts the first detection signal UP, the second detection signal DN, and the intermediate signal CKR to a control clock signal CLK. The intermediate signal CKR is an intermediate signal in the process that the phase frequency detector 302 generates the first detection signal UP and the second detection signal DN, also, the intermediate signal CKR is a previous stage signal of the first detection signal UP and the second detection signal DN. The counting module 308 is coupled to the gated ring oscillator 306, the second conversion module 312 and the D flip-flop 310 to receive the clock signals Q[1]~Q[n], the control clock signal CLK and the sign bit (Sign). According to the control clock signal CLK, the counting module 308 controls the timing of receiving the clock signals Q[1]~Q[n] and generating and outputting the digital signal OUT. Generating the digital signal OUT includes combining the sign bit (Sign) with the values generated according to the clock signals Q[1]~Q[n].

The phase frequency detector 302 generates the first detection signal UP and the second detection signal DN according to the first clock signal IN1 and the second clock signal IN2. The first detection signal UP and the second detection signal DN may be used to response the phase difference between the first clock signal IN1 and the second clock signal IN2. When the phase of the first clock signal IN1 leads the phase of the second clock signal IN2, the pulse width of the first detection signal UP is greater than the pulse width of the second detection signal DN. When the phase of the second clock signal IN2 leads the phase of the first clock signal IN1, the pulse width of the second detection signal DN is greater than the pulse width of the first detection signal UP. The pulse width difference between the first detection signal UP and the second detection signal DN corresponds to the phase difference between the first clock signal IN1 and the second clock signal IN2. According to some embodiments of the present invention, the structure of the phase frequency detector 302 may be the same as the structure of the phase frequency detector 202.

The first conversion module 304 includes an OR gate 314 and an AND gate 316. The OR gate 314 receives the first detection signal UP and the second detection signal DN output by the phase frequency detector 302, so as to select one signal with a wider pulse width from the first detection signal UP and the second detection signal DN as the first control signal EN. The OR gate 314 outputs the first control signal EN to the gated ring oscillator 306. The AND gate 316 receives the first detection signal UP and the second detection signal DN output by the phase frequency detector 302, so as to select the other signal with a narrower pulse width from the first detection signal UP and the second detection signal DN as the second control signal DIS. The AND gate 316 outputs the second control signal DIS to the gated ring oscillator 306.

The gated ring oscillator 306 includes inverters 306-1, 306-2, 306-3, 306-4, . . . , 306-n, wherein n is odd. Each of the inverters includes an input terminal and an output terminal. The input terminal of each of the inverters connects to the output terminal of the previous stage inverter to receive a clock signal output by the previous stage inverter. The output terminal of each of the inverters connects to the input terminal of the next stage inverter to send a clock signal to the next state inverter. The output terminal of the last stage of the inverters, such as the output terminal of the inverter 306-n, is coupled to the input terminal of the first stage inverter, such as the input terminal of the inverter 306-1, so as to form a ring. The inverters 306-1, 306-2, 306-3, 306-4, . . . , 306-n generate corresponding clock signals Q[1], Q[2], Q[3], Q[4], Q[n], herein the clock signals Q[1]~Q[n] have a certain phase difference with each other.

The D flip-flop 310 includes a data input terminal, a clock input terminal, and a data output terminal. The data input terminal of the D flip-flop 310 receives the first detection signal UP, the clock input terminal of the D flip-flop 310 receives the second detection signal DN. The D flip-flop 310 samples the first detection signal UP under the control of the second detection signal DN, so as to generate and output the sign bit (Sign). The sign bit (Sign) indicates whether the phase of the first clock signal IN1 leads the phase of the second clock signal IN2. Specifically, when the phase of the first clock signal IN1 leads the phase of the second clock signal IN2, the sign bit has a second value, such as "1". When the phase of the second clock signal IN2 leads the phase of the first clock signal IN1, the sign bit has a first value, such as "0".

The second conversion module 312 includes a plurality of logic modules to process the first detection signal UP and the second detection signal DN to generate the control clock signal CLK. The counting module 308 includes a value corresponding to the phase difference between the first control signal EN and the second control signal DIS, herein the value is generated by counting the clock signals Q[1]~Q[n]. The value also corresponds to the phase difference between the first detection signal UP and the second detection signal DN, that is, the value corresponds to the phase difference between the first clock signal IN1 and the second clock signal IN2. Further, the counting module 308 combines the sign bit (Sign) and the value corresponding to the phase difference between the first clock signal IN1 and the second clock signal IN2, to generate and output the digital signal OUT. The digital signal OUT represents the phase relationship between the first clock signal IN1 and the second clock signal IN2. The operation of the time-to-digital converter 300 will be further described in conjunction with FIG. 4.

Figure 4:
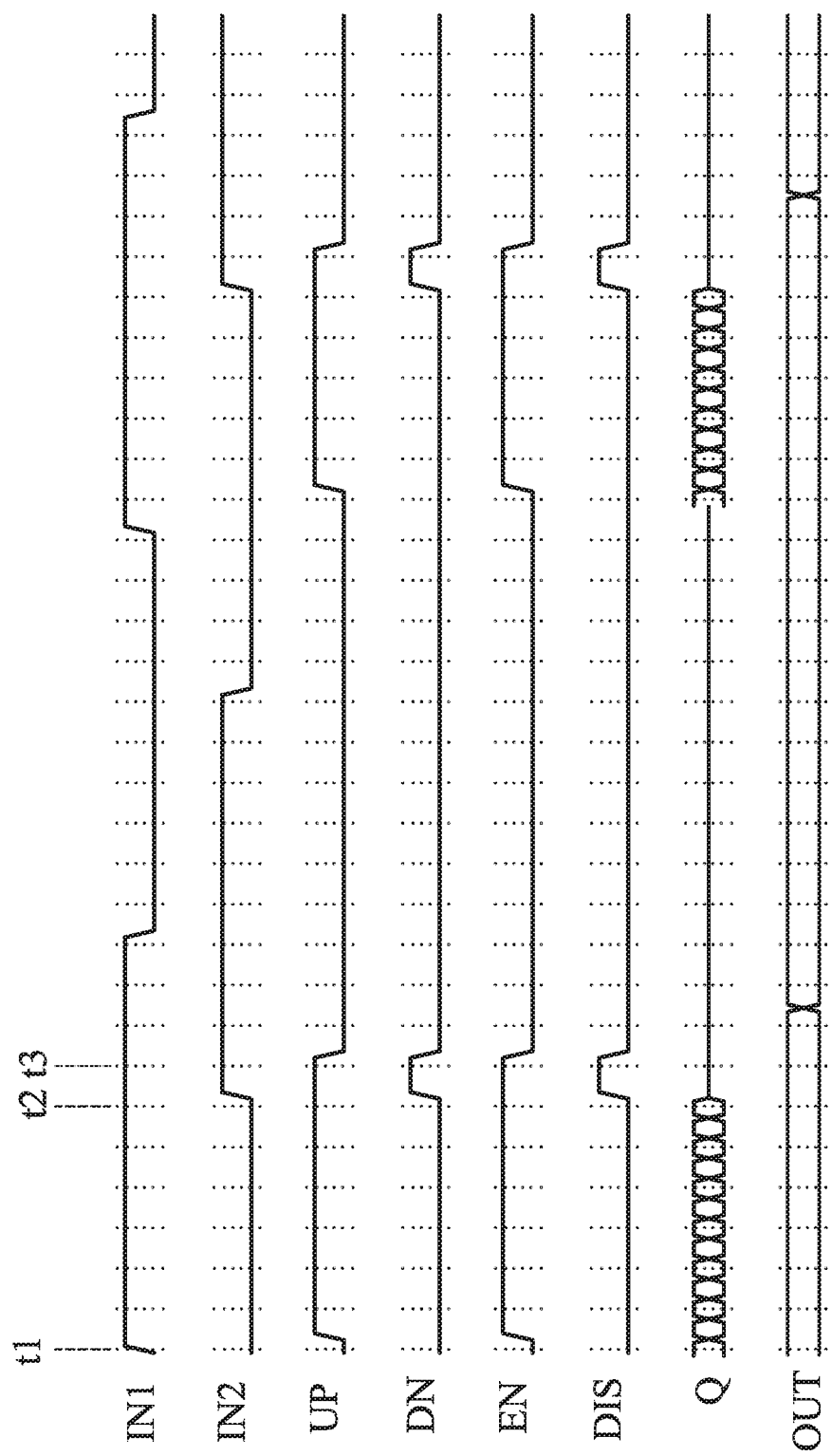
FIG. 4 is a timing diagram of related signals of the time-to-digital convertor 300 in accordance with some embodiments of the disclosure.

FIG. 4 is a timing diagram of related signals of the time-to-digital convertor 300 in accordance with some embodiments of the disclosure. As shown in FIG. 4, for example, at a time point t1, the first clock signal IN1 changes from a first voltage level, such as a low voltage level, to a second voltage level, such as a high voltage level. And at a time point t2, the second clock signal IN2 changes from the first voltage level to the second voltage level. The phase of the first clock signal IN1 leads the phase of the second clock signal IN2. Therefore, the pulse width of the first detection signal UP with the second voltage level as indicated from the time point t1 to a time point t3 is wider than the pulse width of the second detection signal DN with the second voltage level as indicated from the time point t2 to the time point t3. The pulse width difference between the first detection signal UP and the second detection signal DN corresponds to the phase difference between the first clock signal IN1 and the second clock signal IN2, i.e., the time difference between the time point t2 and the time point t1. Herein the minimum pulse width of the first detection signal UP and the second detection signal DN has been preset to be greater than the time required for the rising and falling edges of the signals output by the inverters. That is, the minimum pulse width of the first detection signal UP and the second detection signal DN has been preset to be greater than the minimum pulse width of the signal that the inverter can propagate, so that the first control signal EN and the second control signal DIS may effectively control the gated ring oscillator 306.

As shown in FIG. 4, when the phase of the first clock signal IN1 leads the phase of the second clock signal IN2, the first clock signal IN1 changes from the first voltage level to the second voltage level at the time point t1, such as from the low voltage level to the high voltage level, the first detection signal UP changes from the first voltage level to the second voltage level at the time point t1. When the first clock signal IN1 is at the second voltage level, and the second clock signal IN2 changes from the first voltage level to the second voltage level at the time point t2, the second detection signal DN changes from the first voltage level to the second voltage level at the time point t2. When the first detection signal UP and the second detection signal DN are both at the second voltage level between the time point t2 and the time point t3, the first detection signal UP and the second detection signal DN both change from the second voltage level to the first voltage level at the time point t3.

The first conversion module 304 selects one signal with the wider pulse width from the first detection signal UP and the second detection signal DN as the first control signal EN, and selects the other signal with the narrower pulse width from the first detection signal UP and the second detection signal DN as the second control signal DIS. The gated ring oscillator 306 receives the first control signal EN and the second control signal DIS. When only the first control signal EN is 1, the gated ring oscillator 306 oscillates. When both the first control signal EN and the second control signal DIS are 1 or the first control signal EN is at the low voltage level, the gated ring oscillator 306 stops oscillating. Specifically, the gated ring oscillator 306 starts to output the clock signals Q[1]~Q[n] in response to the rising edge of the first control signal EN, and stops outputting the clock signals Q[1]~Q[n] in response to the rising edge of the second control signal DIS. Theoretically, the time difference between the rising edges of the first control signal EN and the second control signal DIS may be as small as zero, so that a dead zone may be avoided in the time domain (along the time axis).

In some embodiments, since the phase frequency detector 302 has the function of detecting frequencies and phases, the time-to-digital convertor 300 also has the function of detecting frequencies and phases. For example, the detection range of the phase difference between the first clock signal IN1 and the second clock signal IN2 by the phase frequency detector 302 is plus or minus one clock period, so that the detection range of the phase difference between the first clock signal IN1 and the second clock signal IN2 by the time-to-digital convertor 300 is also plus or minus one clock period. In combination with the components shown in FIG. 3, for the phase difference between the first clock signal IN1 and the second clock signal IN2, the detection accuracy of the time-to-digital convertor 300 may be as low as 10 picoseconds, so that even if the phase difference between the first clock signal IN1 and the second clock signal IN2 is between 10 picoseconds and 100 picoseconds, the phase difference between the first clock signal IN1 and the second clock signal IN2 may be measured. Herein, the digital signal OUT is the integer part of the quotient of the phase difference and the detection accuracy.

Figure 5:
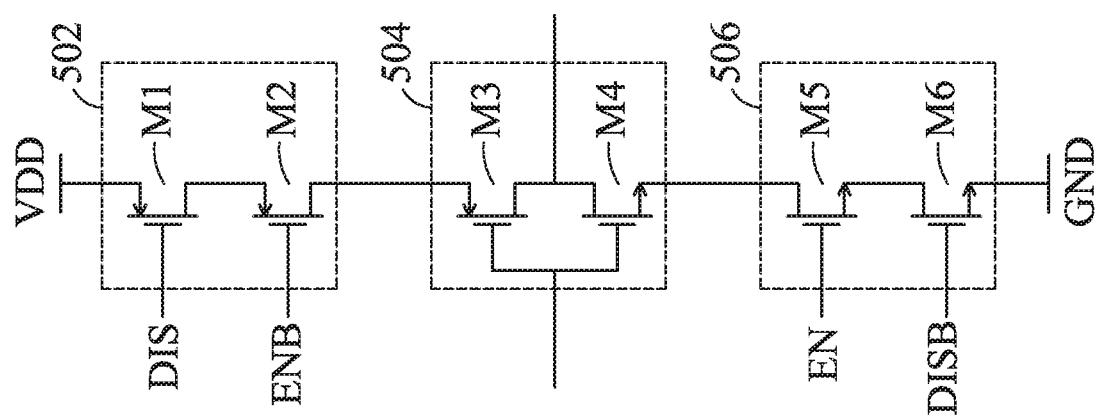
FIG. 5 is a schematic diagram of each of a plurality of inverters 500 in a gated ring oscillator 306 in accordance with some embodiments of the disclosure.

FIG. 5 is a schematic diagram of each of a plurality of inverters 500 in a gated ring oscillator 306 in accordance with some embodiments of the disclosure. As shown in FIG. 5, each inverter 500 of the inverters, such as the inverter 306-1, includes a first switch 502, a basis inverter 504, and a second switch 506. The first switch 502 couples between a power voltage VDD and the basis inverter 504. The first switch 502 receives the second control signal DIS and an inverted signal of the first control signal EN. Hereinafter, the inverted signal of the first control signal EN is referred to as a first control inverted signal ENB. The second switch 506 couples between the basis inverter 504 and a ground voltage GND. The second switch 506 receives the first control signal EN and an inverted signal of the second control signal DIS. Hereinafter, the inverted signal of the second control signal is referred to as a second control inverted signal DISB. The first switch 502 and the second switch 506 enables or disables the basis inverter 504 according to the first control signal EN, the first control inverted signal ENB, the second control signal DIS, and the second control inverted signal DISB.

Specifically, as shown in FIG. 5, the first switch includes a P-type transistor M1 and a P-type transistor M2. The source of the P-type transistor M1 is coupled to the power voltage VDD, the gate of the P-type transistor M1 receives the second control signal DIS, the drain of the P-type transistor M1 is coupled to the source of the P-type transistor M2. The gate of the P-type transistor M2 receives the first control inverted signal ENB, the drain of the P-type transistor M2 couples the basis inverter 504. Herein, the power voltage VDD is the power voltage of the gated ring oscillator 306. The basis inverter 504 includes a P-type transistor M3 and an N-type transistor M4. The source of the P-type transistor M3 is coupled to the drain of the P-type transistor M2, the gate of the P-type transistor M3 is coupled to the gate of the N-type transistor M4, the drain of the P-type transistor M3 is coupled to the drain of the N-type transistor M4. The source of the N-type transistor M4 is coupled to the second switch 506. The gate of the P-type transistor M3 and the gate of the N-type transistor M4 are connected as an input terminal of the inverter 500. The drain of the P-type transistor M3 and the drain of the N-type transistor M4 are connected as an output terminal of the inverter 500. The second switch 506 includes an N-type transistor M5 and an N-type transistor M6. The drain of the N-type transistor M5 is coupled to the source of the N-type transistor M4, the gate of the N-type transistor M5 receives the first control signal EN, and the source of the N-type transistor M5 is coupled to the drain of the N-type transistor M6. The gate of the N-type transistor M6 receives the second control inverted signal DISB, and the source of the N-type transistor M6 is coupled to the ground voltage GND.

In some embodiments, the inverter 500 shown in FIG. 5 further includes two inverters. The two inverters are used to respectively convert the first control signal EN to the first control inverted signal ENB and convert the second control signal DIS to the second control inverted signal DISB.

In some embodiments, the two inverters are arranged outside the inverter 500 shown in FIG. 5. The two inverters are used to respectively convert the first control signal EN to the first control inverted signal ENB and convert the second control signal DIS to the second control inverted signal DISB, and then output the first control inverted signal ENB and the second control inverted signal DISB to the inverter 500 shown in FIG. 5.

The first switch 502 and the second switch 506 are controlled by the first control signal EN and the second control signal DIS output by the first conversion module 304. When the first control signal EN is at the second voltage level, such as the high voltage level, and the second control signal DIS is at the first voltage level, such as the low voltage level, the first switch 502 and the second switch 506 are both turned on, and the gated ring oscillator 306 outputs the clock signals Q[1]~Q[n]. When the second control signal DIS is at the second voltage level, the first switch 502 and/or the second switch is turned off, and the gated ring oscillator 306 stops outputting the clock signals Q[1]~Q[n].

Figure 6:
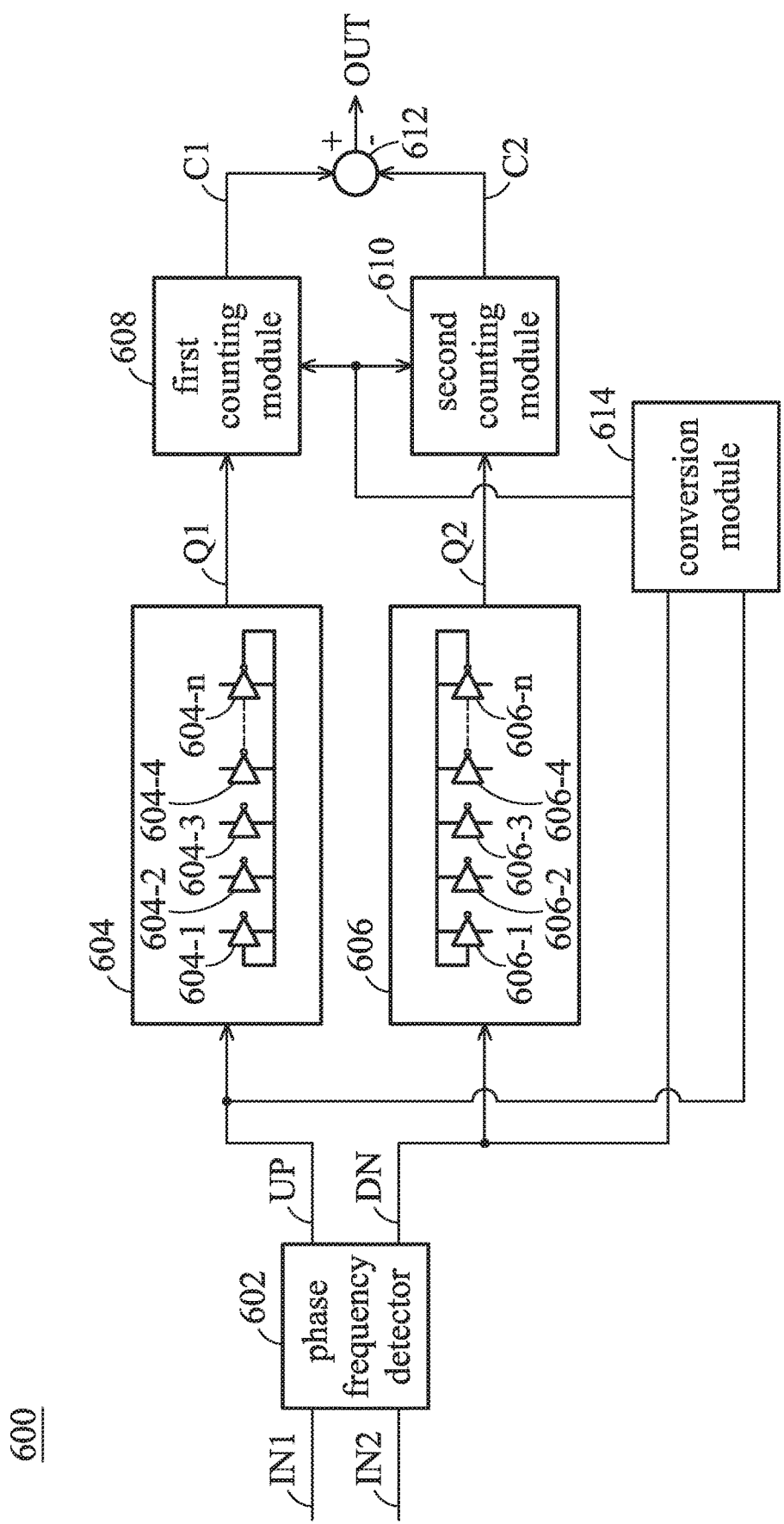
FIG. 6 is a schematic diagram of a time-to-digital convertor 600 in accordance with some embodiments of the disclosure.

FIG. 6 is a schematic diagram of a time-to-digital convertor 600 in accordance with some embodiments of the disclosure. As shown in FIG. 6, the time-to-digital convertor 600 includes a phase frequency detector 602, a first gated ring oscillator 604, a second gated ring oscillator 606, a first counting module 608, a second counting module 610, a subtractor 612, and a conversion module 614. The phase frequency detector 602 receives the first clock signal IN1 and the second clock signal IN2, and generates the first detection signal UP and the second detection signal DN according to the first clock signal IN1 and the second clock signal IN2. The first detection signal UP and the second detection signal DN may be used to response the phase difference between the first clock signal IN1 and the second clock signal IN2. When the pulse width of the first detection signal UP is wider than the pulse width of the second detection signal DN, the phase of the first clock signal IN1 leads the phase of the second clock signal IN2. When the pulse width of the second detection signal DN is wider than the pulse width of the first detection signal UP, the phase of the second clock signal IN2 leads the phase of the first clock signal IN1. The pulse width difference between the first detection signal UP and the second detection signal DN corresponds to the phase difference between the first clock signal IN1 and the second clock signal IN2.

The first gated ring oscillator 604 directly receives the first detection signal UP output by the phase frequency detector 602 and takes the first detection signal UP as a control signal. The first gated ring oscillator 604 responses to the rising edge of the first detection signal UP to output first clock output signals Q1[1]~Q1[n]. The first gated ring oscillator 604 includes inverters 604-1, 604-1, 604-3, 604-4, ..., 604-n, wherein n is odd. Each of the inverters includes an input terminal and an output terminal. The input terminal of each of the inverters connects to the output terminal of the previous stage inverter to receive a clock signal output by the previous stage inverter. The output terminal of each of the inverters connects to the input terminal of the next stage inverter to send a clock signal to the next state inverter. The output terminal of the last stage of the inverters, such as the output terminal of the inverter 604-n, is coupled to the input terminal of the first stage inverter, such as the input terminal of the inverter 604-1, to form a ring. The inverters 604-1, 604-2, 604-3, 604-4, ..., 604-n respectively generate corresponding first clock output signals Q1[1], Q1[2], Q1[3], Q1[4], ..., Q1[n]. The first clock output signals Q1[1]~Q1[n] have a certain phase difference with each other. Each of the inverters further includes two control terminals to respectively receive the first detection signal UP and an inverted signal (UPB) of the first detection signal UP, so that the first gated ring oscillator 604 may determine whether to output the first clock output signals Q1[1]~Q1[n] according to the first detection signal UP.

The second gated ring oscillator 606 directly receives the second detection signal DN output by the phase frequency detector 602 and takes the second detection signal DN as a control signal. The second gated ring oscillator 606 responses to the rising edge of the second detection signal DN to output second clock output signals Q2[1]~Q2[n]. The second gated ring oscillator 606 includes inverters 606-1, 606-1, 606-3, 606-4, ..., 606-n, wherein n is odd. Each of the inverters includes an input terminal and an output terminal. The input terminal of each of the inverters connects to the output terminal of the previous stage inverter to receive a clock signal output by the previous stage inverter. The output terminal of each of the inverters connects to the input terminal of the next stage inverter to send a clock signal to the next state inverter. The output terminal of the last stage of the inverters, such as the output terminal of the inverter 606-n, is coupled to the input terminal of the first stage inverter, such as the input terminal of the inverter 606-1, to form a ring. The inverters 606-1, 606-2, 606-3, 606-4, ..., 606-n respectively generate corresponding second clock output signals Q2[1], Q2[2], Q2[3], Q2[4], Q2[n]. The second clock output signals Q2[1]~Q2[n] have a certain phase difference with each other. Each of the inverters further includes two control terminals to respectively receive the second detection signal DN and an inverted signal (DNB) of the second detection signal DN, so that the second gated ring oscillator 606 may determine whether to output the second clock output signals Q2[1]~Q2[n] according to the second detection signal DN.

The conversion module 614 is coupled to the phase frequency detector 602 to receive the first detection signal UP and the second detection signal DN. The conversion module 614 includes a plurality of logic modules to perform logic conversion on the first detection signal UP and the second detection signal DN to generate and output a control clock signal CLK. In some embodiments, the conversion module 614 may be regarded as the same as the second conversion module 312 shown in FIG. 3.

The first counting module 608 is coupled to the first gated ring oscillator 604 and the conversion module 614 to respectively receive the first clock output signals Q1[1]~Q1[n] and the control clock signal CLK. The first counting module 608 counts the first clock output signals Q1[1]~Q1[n] under the control of the control clock signal CLK to generate a first value C1, herein the first value C1 corresponds to the pulse width of the first clock signal IN1.

The second counting module 610 is coupled to the second gated ring oscillator 606 and the conversion module 614 to respectively receive the second clock output signals Q2[1]~Q2[n] and the control clock signal CLK. The second counting module 610 counts the second clock output signals Q2[1]~Q2[n] under the control of the control clock signal CLK to generate a second value C2, herein the second value C2 corresponds to the pulse width of the second clock signal IN2.

The subtractor 612 is coupled to the first counting module 608 and the second counting module 610 to respectively receive the first value C1 and the second value C2. The subtractor 612 subtracts the second value C2 from the first value C1 to obtain a digital signal OUT, herein the digital signal OUT corresponds to the phase difference between the first clock signal IN1 and the second clock signal IN2. Due to the subtraction, the digital signal OUT consequentially has sign information to indicate the phase relationship between the first clock signal IN1 and the second clock signal IN2.

Figure 7:
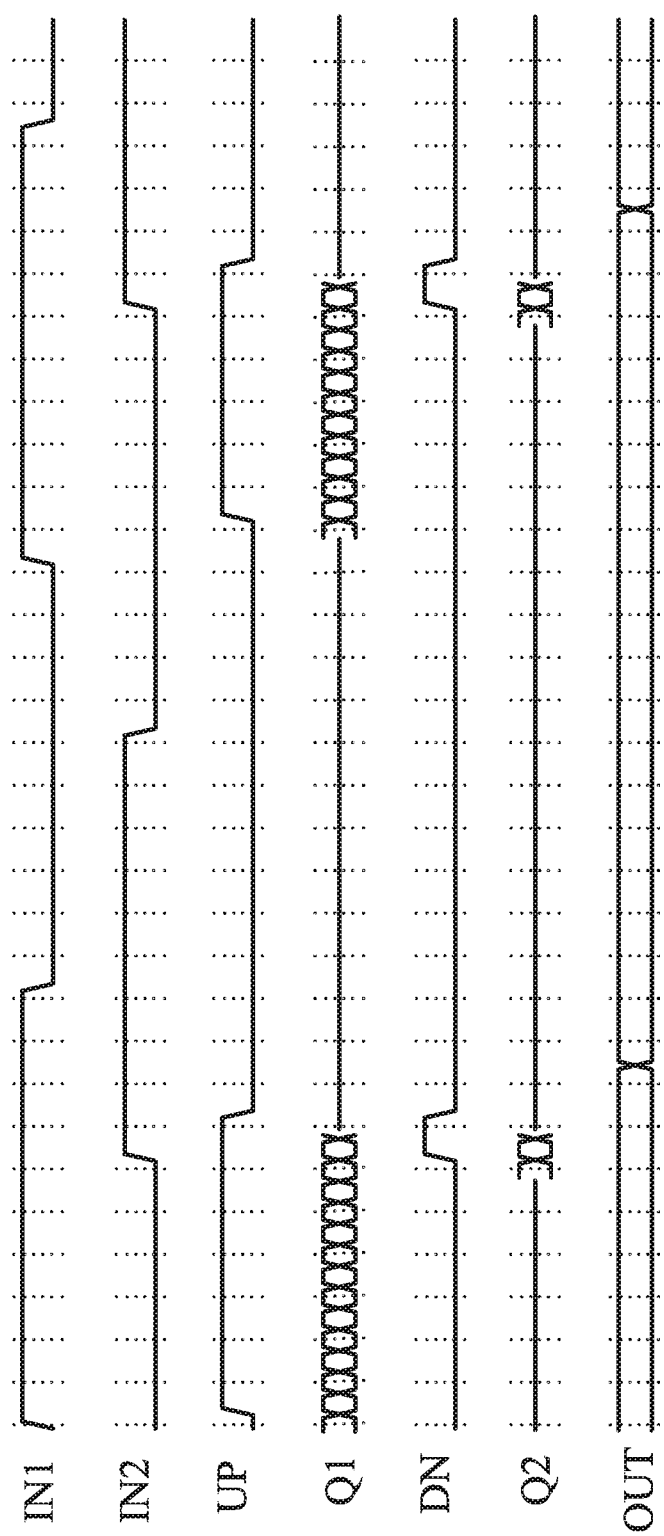
FIG. 7 is a timing diagram of related signals of the time-to-digital convertor 600 in accordance with some embodiments of the disclosure.

FIG. 7 is a timing diagram of related signals of the time-to-digital convertor 600 in accordance with some embodiments of the disclosure. The timing relationship among the first clock signal IN1, the second clock signal IN2, the first detection signal UP and the second detection signal DN in FIG. 7 is the same as that shown in FIG. 4, so it will not be repeated. The first gated ring oscillator 604 and the second gated ring oscillator 606 are respectively controlled by the first detection signal UP and the second detection signal DN. When the first detection signal UP is at the second voltage level, such as the high voltage level, the first gated ring oscillator 604 is turned on, and the first gated ring oscillator 604 outputs the first clock output signals Q1[1]~Q1[n]. When the first detection signal UP is at the first voltage level, such as the low voltage level, the first gated ring oscillator 604 is turned off. When the second detection signal DN is at the second voltage level, such as the high voltage level, the second gated ring oscillator 606 is turned on, and the second gated ring oscillator 606 outputs the second clock output signals Q2[1]~Q2[n]. When the second detection signal is at the first voltage level, such as the low voltage level, the second gated ring oscillator 606 is turned off.

According to FIG. 4 and FIG. 7, although the structures of the time-to-digital convertor 300 and the time-to-digital convertor 600 are different, the same digital signal OUT related to the phase difference between the first clock signal IN1 and the second clock signal IN2 may be obtained in the end. The difference between the time-to-digital convertor 300 and the time-to-digital convertor 600 is that the time-to-digital convertor 300 controls the output of the gated ring oscillator 306 through the first control signal EN and the second control signal DIS generated by the first conversion module 304, and combines the operations of the counting module 308 and the D flip-flop 310 to obtain the pulse width difference between the first detection signal UP and the second detection signal DN. The time-to-digital convertor 600 directly controls the output of the first gated ring oscillator 604 through the first detection signal UP, controls the output of the second gated ring oscillator 606 though the second detection signal DN, and combines the operations of the first counting module 608, the second counting module 610 and the subtractor 612 to directly obtain a difference between the first value C1 and the second value C2, so that the pulse width difference between the first detection signal UP and the second detection signal DN is responded in the digital signal OUT.

In some embodiments, since the phase frequency detector 602 has the function of detecting frequencies and phases, the time-to-digital convertor 600 also has the function of detecting frequencies and phases. For example, the detection range of the phase difference between the first clock signal IN1 and the second clock signal IN2 by the phase frequency detector 602 is plus or minus one clock period, the detection range of the phase difference between the first clock signal IN1 and the second clock signal IN2 by the time-to-digital convertor 600 is also plus or minus one clock period. In combination with the components shown in FIG. 6, for the time-to-digital convertor 600, the detection accuracy of measuring the phase difference may be as low as 10 picoseconds, so that the phase difference between 10 picoseconds and 100 picoseconds may be measured, herein the phase difference is between the first clock signal IN1 and the second clock signal IN2.

Figure 8:
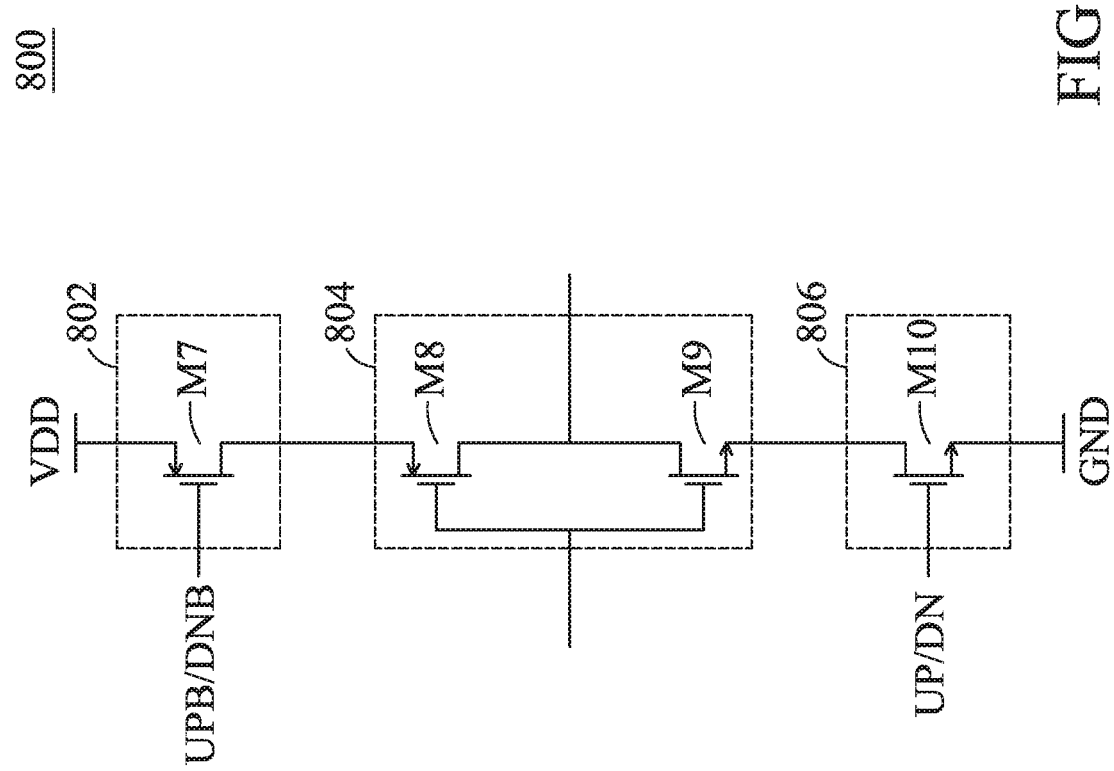
FIG. 8 is a schematic diagram of an inverter 800 in accordance with some embodiments of the disclosure.

FIG. 8 is a schematic diagram of each inverter 800 of the inverters in the first gated ring oscillator 604 or the second gated ring oscillator 606 in accordance with some embodiments of the disclosure. As shown in FIG. 8, the converter 800 includes a first switch 802, a base switch 804, and a second switch 806. The first switch 802 couples between the power voltage VDD and the basis inverter 804. The basis inverter 804 couples between the first switch 802 and the second switch 806. The second switch 806 couples between basis inverter 804 and the ground voltage GND. When the inverter 800 is one of the inverters 604-1, 604-2, 604-3, 604-4, . . . , 604-n, the second switch 806 and the first switch 802 respectively receive the inverted signal (UPB) of the first detection signal UP and the first detection signal UP. Hereinafter, the inverted signal of the first detection signal UP is referred to as a first detection inverted signal UPB. When the inverter 800 is one of the inverters 606-1, 606-2, 606-3, 606-4, . . . , 606-n, the second switch 806 and the first switch 802 respectively receive the inverted signal (DNB) of the second detection signal DN and the second detection signal DN. Hereinafter, the inverted signal of the second detection signal DN is referred to as a second detection inverted signal DNB.

Specifically, as shown in FIG. 8, the first switch 802 includes a P-type transistor M7. The source of the P-type transistor M7 is coupled to the power voltage VDD, the gate of the P-type transistor M7 is coupled to the first detection inverted signal UPB or the second detection inverted signal DNB, and the drain of the P-type transistor M7 is coupled to the basis inverter 804. When the inverter 800 is one of the inverters 604-1, 604-2, 604-3, 604-4, . . . , 604-n, the power voltage VDD is the power voltage of the first gated ring oscillator 604, and the gate of the P-type transistor M7 is coupled to the first detection inverted signal UPB. When the inverter 800 is one of the inverters 606-1, 606-2, 606-3, 606-4, . . . , 606-n, the power voltage VDD is the power voltage of the second gated ring oscillator 606, and the gate of the P-type transistor M7 is coupled to the second detection inverted signal DNB. The basis inverter 804 includes a P-type transistor M8, an N-type transistor M9. The source of the P-type transistor M8 is coupled to the drain of the P-type transistor M7. The gate of the P-type transistor M8 is coupled to the gate of the N-type transistor M9. The drain of the P-type transistor M8 is coupled to the drain of the N-type transistor M9. The source of the N-type transistor M9 is coupled to the second switch 806. The gate of the P-type transistor M8 and the gate of the N-type transistor M9 are connected as the input terminal of the inverter 800. The drain of the P-type transistor M8 and the drain of the N-type transistor M9 are connected as the output terminal of the inverter 800. The second switch 806 includes an N-type transistor M10. The drain of the N-type transistor M10 is coupled to the source of the N-type transistor M9 in the basis inverter 804. The gate of the N-type transistor M10 is coupled to the first detection signal UP or the second detection signal DN. The source of the N-type transistor M10 is coupled to the ground voltage GND. When the inverter 800 is one of the inverters 604-1, 604-2, 604-3, 604-4, . . . , 604-n, the gate of the N-type transistor M10 is coupled to the first detection signal UP. When the inverter 800 is one of the inverters 606-1, 606-2, 606-3, 606-4, . . . , 606-n, the gate of the N-type transistor M10 is coupled to the second detection signal DN.

Therefore, when the inverter 800 belongs to the first gated ring oscillator 604, the first detection inverted signal UPB is used to control the on or off status of the first switch 802, the first detection signal UP is used to control the on or off status of the second switch 806, so that the inverter 800 may output or stop outputting the first clock output signals Q1[1]~Q1[n]. When the inverter 800 belongs to the second gated ring oscillator 606, the second detection inverted signal DNB is used to control the on or off status of the first switch 802, the second detection signal DN is used to control the on or off status of the second switch 806, so that the inverter 800 may output or stop outputting the second clock output signals Q2[1]~Q2[n].

Taking the inverter 800 belonging to the first gated ring oscillator 604 as an example, when the first detection signal UP is at the first voltage level, such as the low voltage level, the first detection inverted signal UPB is at the second voltage level, such as the high voltage level, the first switch 802 and the second switch 806 are both turned on. The first gated ring oscillator 604 outputs the first clock output signals Q1[1]~Q1[n] to the first counting module 608. When the first detection signal UP is at the second voltage level, such as the high voltage level, the first detection inverted signal UPB is at the first voltage level, such as the low voltage level, the first switch 802 and the second switch 806 are both turned off. The first gated ring oscillator 604 does not output.

Taking the inverter 800 belonging to the second gated ring oscillator 606 as an example, when the second detection signal DN is at the first voltage level, such as the low voltage level, the second detection inverted signal DNB is at the second voltage level, such as the high voltage level, the first switch 802 and the second switch 806 are both turned on. The second gated ring oscillator 606 outputs the second clock output signals Q2[1]~Q2[n] to the second counting module 610. When the second detection signal DN is at the second voltage level, such as the high voltage level, the second detection inverted signal DNB is at the first voltage level, such as the low voltage level, the first switch 802 and the second switch 806 are both turned off. The second gated ring oscillator 606 does not output.

In some embodiments, the inverter 800 shown in FIG. 8 further includes an inverter. The inverter converts the first detection signal UP to the first detection inverted signal UPB, or converts the second detection signal DN to the second detection inverted signal DNB. In some embodiments, the inverter further included in the inverter 800 may be regarded as one of the driving inverters of the corresponding gated ring oscillator.

In some embodiments, an inverter may be arranged outside the inverter 800. The inverter converts the first detection signal UP to the first detection inverted signal UPB, or converts the second detection signal DN to the second detection inverted signal DNB, and then outputs the first detection inverted signal UPB or the second detection inverted signal DNB to the inverter 800 shown in FIG. 8. In some embodiments, the inverter further arranged outside the inverter 800 may be regarded as one of the driving inverters of the corresponding gated ring oscillator.

Figure 9:
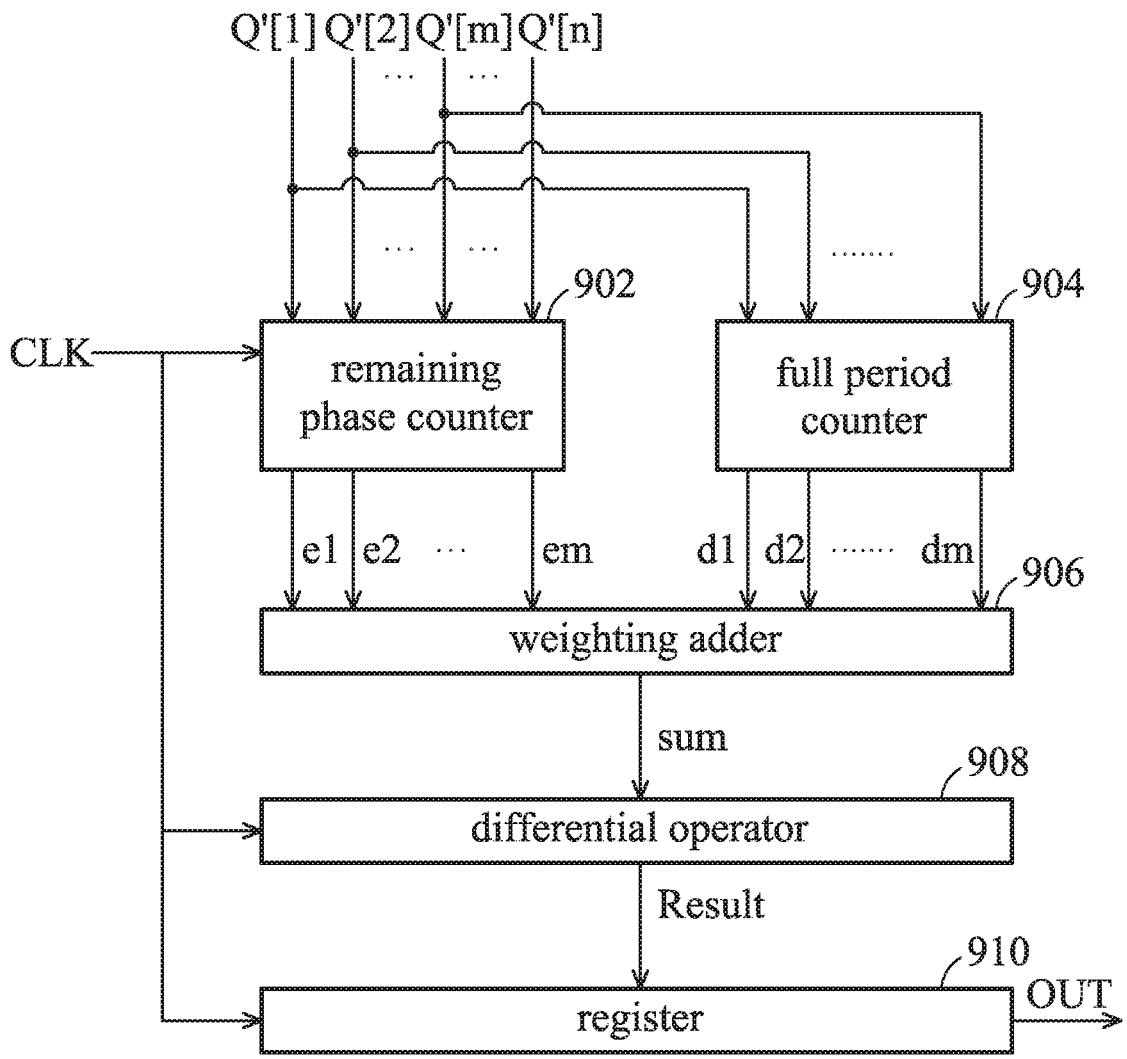
FIG. 9 is a schematic diagram of a counting module 900 in accordance with some embodiments of the disclosure.

FIG. 9 is a schematic diagram of a counting module 900 in accordance with some embodiments of the disclosure. The counting module 900 is the counting module 308 or the first counting module 608 or the second counting module 610 in the foregoing embodiments. The structures of the counting module 308, the first counting module 608 and the second counting module 610 are similar.

As shown in FIG. 9, the counting module 900 includes a remaining phase counter 902, a full period counter 904, a weighting adder 906, a differential operator 908, and a register 910. The remaining phase counter 902 receives the control clock signal CLK and clock signals Q'[1]~Q'[n], and generates m phase counting results e1~em according to the control clock signal CLK and the clock signals Q'[1]~Q'[n], wherein m is a positive integer more than or equal to 1, and less than or equal to n. The full period counter 904 receives the first m clock signals of the clock signals Q'[1]~Q'[n], and generates m period counting results d1~dm according to the first m clock signals of the clock signals Q'[1]~Q'[n]. The weighting adder 906 is coupled to the remaining phase counter 902 and the full period counter 904 to respectively receive the phase counting results e1~em and the period counting results d1~dm, and generates a calculation result (Sum) according to the phase counting results e1~em and the period counting results d1~dm. The differential operator 908 receives the control clock signal CLK and is coupled to the weighting adder 906 to receive the calculation result (Sum). According to the control clock signal CLK, the current calculation results (Sum) and the previous calculation results (Sum), the differential operator 908 generates a phase difference (Result). The register 910 receives the control clock signal CLK and is coupled to the differential operator 908 to receive the phase difference (Result). The control clock signal CLK controls the register 910 to output the phase difference (Result) as the digital signal OUT.

When the counting module 900 is the counting module 308 in the foregoing embodiments, the clock signals Q'[1]~Q'[n] are the clock signals Q[1]~Q[n]. When the counting module 900 is the first counting module 608 in the foregoing embodiments, the clock signals Q' [1]~Q' [n] are the first clock output signals Q1[1]~Q1[n]. When the counting module 900 is the second counting module 610 in the foregoing embodiments, the clock signals Q'[1]~Q'[n] are the second clock output signals Q2[1]~Q2[n].

Specifically, the full period counter 904 receives the first m clock signals of the clock signals Q'[1]~Q'[m]. The full period counter 904 selects a rising edge or a falling edge of the clock signals Q'[1]~Q'[m] as a clock boundary to count the rising edges of each of the clock signals Q'[1]~Q'[m], so as to correspondingly generate the m period counting results d1~dm. Each of the period counting results d1~dm represents the number of full clock periods taken by a corresponding clock signal Q'[1]~Q'[m]. Each of the period counting results d1~dm has multiple bits.

The remaining phase counter 902 receives the clock signals Q'[1]~Q'[n], and divides the clock signals Q'[1]~Q' [n] into m groups according to the clock boundary selected by the full period counter 904, to avoid phase-judgment errors caused by excessively close phases between the clock signals. For example, the clock boundary selected by the full period counter 904 is a rising edge of the clock signal Q'[1], when n=12 and m=3, the clock signals Q' [1]~Q' [12] may be divided into 3 groups, such as, the clock signals Q' [1], Q' [4], Q' [7] and Q'[10] are the first group, the clock signals Q'[2], Q'[5], Q'[8] and Q'[11] are the second group, and the clock signals Q'[3], Q'[6], Q' [9] and Q' [12] are the third group. Adjacent clock signals of the clock signals Q' [1]~Q' [12] may be arranged in the form of Q'[1], Q'[2], Q' [3], . . . , Q'[11], Q' [12] according to a relationship, herein the relationship is the former leads a certain fixed phase of the latter, or lags behind a certain fixed phase of the latter. When n=13 and m=3, the clock signals Q'[1]~Q'[13] may be divided into 3 groups, such as, the clock signals Q'[1], Q' [4], Q' [7] and Q' [10] are the first group, the clock signals Q' [2], Q'[5], Q' [8] and Q' [11] are the second group, and the clock signals Q' [3], Q' [6], Q' [9], Q' [12] and Q' [13] are the third group.

In some embodiments, when the gated ring oscillator stops oscillating, according to the phase state of the clock signals Q'[1]~Q'[n], the remaining phase counter 902 determines the values of the remaining phases through a state machine to generate and output the m phase counting results e1~em, herein the remaining phases are less than one clock period, and the clock period refers to the clock period of the clock signals Q'[1]~Q'[n]. Each of the phase counting results e1~em represents the value of phase less than one clock period of each of the clock signals Q'[1]~Q'[m]. Each of the phase counting results e1~em has multiple bits.

In some embodiments, when the gated ring oscillator stops oscillating, according to the phase state of the clock signals Q'[1]~Q'[n], the remaining phase counter 902 determines the values of remaining phases through a state machine to generate and output the m phase counting results e1~em, herein the remaining phases are less than one clock period, and the clock period refers to the clock period of the clock signals Q'[1]~Q'[n]. Each of the phase counting results e1~em represents the value of phase less than one clock period of each of the clock signals in a corresponding group. Each of the phase counting results e1~em has multiple bits.

The weighting adder 906 performs a weighting summation on the phase counting results e1~em and the period counting results d1~dm to obtain the current calculation result (Sum).

The differential operator 908 is coupled to the weighting adder 906 to receive the calculation result (Sum). According to the control clock signal CLK, the differential operator 908 subtracts the calculation result (Sum) obtained in the previous clock period of the control clock signal CLK from the calculation result (Sum) obtained in the current clock period of the control clock signal CLK, so that the phase difference (Result) representing the phase difference of the current clock period of the control clock signal CLK is obtained.

In some embodiments, when the counting module 900 is the counting module 308 in the foregoing embodiments, the differential operator 908 further receives the sign bit (Sign). The differential operator 908 needs to combine the subtraction result with the sign bit (Sign) to obtain the phase difference (Result). In some embodiments, when the counting module 900 is the first counting module 608 or the second counting module 610 in the foregoing embodiments, the subtraction result may be directly taken as the phase difference (Result). The subtraction result is the result of subtracting the calculation result (Sum) obtained in the previous clock period of the control clock signal CLK from the calculation result (Sum) obtained in the current clock period of the control clock signal CLK.

The ordinals in the specification and the claims of the present invention, such as "first", "second", "third", etc., have no sequential relationship, and are just for distinguishing between two different components with the same name. In the specification of the present invention, the word "couple" refers to any kind of direct or indirect electronic connection. The present invention is disclosed in the preferred embodiments as described above, however, the breadth and scope of the present invention should not be limited by any of the embodiments described above. Persons skilled in the art can make small changes and retouches without departing from the spirit and scope of the invention. The scope of the invention should be defined in accordance with the following claims and their equivalents.

What is claimed is:

1. A time-to-digital convertor, receiving a first clock signal and a second clock signal, and outputting a phase relationship between the first clock signal and the second clock signal, comprising:

a phase frequency detector, receiving the first clock signal and the second clock signal, and outputting a first detection signal and a second detection signal, wherein the pulse width difference between the first detection signal and the second detection signal corresponds to the phase difference between the first clock signal and the second clock signal;

a first conversion module, coupled to the phase frequency detector to receive the first detection signal and the second detection signal, wherein the first conversion module selects one with a wider pulse width from the first detection signal and the second detection signal as a first control signal, and selects the other with a narrower pulse width from the first detection signal and the second detection signal as a second control signal;

an oscillator, coupled to the first conversion module to receive the first control signal and the second control signal, wherein the oscillator outputs a plurality of clock signals according to the pulse width difference between the first detection signal and the second detection signal; and a counting module, coupled to the oscillator to receive the plurality of clock signals, wherein the counting module counts the plurality of clock signals to generate the phase difference between the first clock signal and the second clock signal.

2. The time-to-digital convertor as claimed in claim 1, further comprising a second conversion module, wherein the second conversion module is coupled to the phase frequency detector to receive the first detection signal and the second detection signal, and the second conversion module outputs a control clock signal.

3. The time-to-digital convertor as claimed in claim 2, wherein the counting module is coupled to the second conversion module to receive the control clock signal, the counting module counts the plurality of clock signals according to the control clock signal.

4. The time-to-digital convertor as claimed in claim 3, wherein the counting module comprises:

a full period counter, receiving a first number of clock signals of the plurality of clock signals to count full periods of each of the first number of clock signals, wherein the full period counter outputs a first count;

a remaining phase counter, receiving the plurality of clock signals, dividing the plurality of clock signals into the first number of groups, and counting a non-full period of each of the plurality of clock signals in the first number of groups according to the control clock signal, wherein the remaining phase counter outputs a second count;

a weighting adder, coupled to the full period counter and the remaining phase counter to respectively receive the first count and the second count, the weighting adder performs weighted summation on the first count and the second count to output a calculation result; and a differential operator, coupled to the weighting adder to receive the calculation result, the differential operator subtracts a previous calculation result from the calculation result according to the control clock signal, to generate the phase difference between the first clock signal and the second clock signal.

5. The time-to-digital convertor as claimed in claim 1, further comprising a D flip-flop, the D flip-flop is coupled to the phase frequency detector to receive the first detection signal and the second detection signal, the D flip-flop outputs a sign bit to the counting module, wherein the sign bit indicates that the first clock signal leads or lags the second clock signal.

6. The time-to-digital convertor as claimed in claim 5, wherein the counting module is coupled to the D flip-flop to receive the sign bit, the counting module combines the sign bit and the phase difference between the first clock signal and the second clock signal to generate the phase relationship between the first clock signal and the second clock signal.

7. The time-to-digital convertor as claimed in claim 1, wherein,
- the first conversion module comprises an OR gate and an AND gate;
- the OR gate receives the first detection signal and the second detection signal, and outputs the first control signal to the oscillator; and
- the AND gate receives the first detection signal and the second detection signal, and outputs the first control signal.

8. The time-to-digital convertor as claimed in claim 1, wherein,
- the oscillator comprises a plurality of inverters;
- each of the plurality of inverters comprises an input terminal and an output terminal;
- the input terminal of each of the plurality of inverters connects to the output terminal of a previous stage inverter;
- the output terminal of each of the plurality of inverters connects to the input terminal of a next stage inverter; and
- the output terminal of the last stage inverter connects to the input terminal of the first stage inverter.

9. The time-to-digital convertor as claimed in claim 8, wherein
- each of the plurality of inverters further comprises a first switch and a second switch;
- the first switch and the second switch receive the first control signal and the second control signal, the first switch and the second switch control whether the oscillator outputs the plurality of clock signals according to the first control signal and the second control signal.

10. The time-to-digital convertor as claimed in claim 9, wherein
- when the first control signal is at a second voltage level and the second control signal is at a first voltage level, the first switch and the second switch are turned on, so that the oscillator is enabled to output the plurality of clock signals.

11. A time-to-digital convertor, receiving a first clock signal and a second clock signal, and outputting a phase relationship between the first clock signal and the second clock signal, comprising:
- a phase frequency detector, receiving the first clock signal and the second clock signal, and outputting a first detection signal and a second detection signal, wherein the pulse width difference between the first detection signal and the second detection signal corresponds to the phase difference between the first clock signal and the second clock signal;
- a first oscillator, coupled to the phase frequency detector to receive the first detection signal, according to the first detection signal, the first oscillator outputs a plurality of first clock output signals;
- a second oscillator, coupled to the phase frequency detector to receive the second detection signal, according to the second detection signal, the second oscillator outputs a plurality of second clock output signals;
- a first counting module, coupled to the first oscillator to receive the plurality of first clock output signals, the first counting module counts the plurality of first clock output signals and outputs a pulse width of the first detection signal;
- a second counting module, coupled to the second oscillator to receive the plurality of second output signals, the second counting module counts the plurality of second output signals and outputs a pulse width of the second detection signal; and
- a subtractor, coupled to the first counting module and the second counting module to receive the pulse width of the first detection signal and the pulse width of the second detection signal, the subtractor subtracts the pulse width of the second detection signal from the pulse width of the first detection signal to output the phase relationship between the first clock signal and the second clock signal.

12. The time-to-digital convertor as claimed in claim 11, further comprising a conversion module,
- wherein the conversion module is coupled to the phase frequency detector to receive the first detection signal and the second detection signal; and
- wherein the conversion module outputs a control clock signal.

13. The time-to-digital convertor as claimed in claim 12, wherein
- the first counting module and the second counting module are coupled to the conversion module to receive the control clock signal;
- the first counting module counts the plurality of first clock output signals according to the control clock signal; and
- the second counting module counts the plurality of second clock output signals according to the control clock signal.

14. The time-to-digital convertor as claimed in claim 13, wherein the first counting module or the second counting module comprises:
- a full period counter, receiving a first number of clock signals of a plurality of clock signals to count full periods of the first number of clock signals, the full period counter outputs a first count, wherein the plurality of clock signals are the plurality of first clock output signals or the plurality of first clock output signals;
- a remaining phase counter, receiving the plurality of clock signals, dividing the plurality of clock signals into the first number of groups, and counting a non-full period of each of the plurality of clock signals in the first number of groups according to the control clock signal, the remaining phase counter outputs a second count;
- a weighting adder, coupled to the full period counter and the remaining phase counter to respectively receive the first count and the second count, the weighting adder performs weighted summation on the first count and the second count to output a calculation result; and
- a differential operator, coupled to the weighting adder to receive the calculation result, the differential operator subtracts a previous calculation result from the calculation result according to the control clock signal to generate the phase difference between the first clock signal and the second clock signal.

15. The time-to-digital convertor as claimed in claim 11, wherein
- the first oscillator and the second oscillator respectively comprise a plurality of inverters; each of the plurality of inverters comprises an input terminal and an output terminal;
- the input terminal of each of the plurality of inverters connects to the output terminal of a previous stage inverter;
- the output terminal of each of the plurality of inverters connects to the input terminal of a next stage inverter; and
- the output terminal of the last stage inverter connects to the input terminal of the first stage inverter.

16. The time-to-digital convertor as claimed in claim 15, wherein
- each of the plurality of inverters in the first oscillator further comprises a first switch and a second switch;
- the first switch receives the first detection signal, and the second switch receives an inverted signal of the first detection signal; and
- the first switch and the second switch control whether the first oscillator outputs the plurality of first clock output signals according to the first detection signal.

17. The time-to-digital convertor as claimed in claim 15, wherein
- each of the plurality of inverters in the second oscillator further comprises a first switch and a second switch;
- the first switch receives the second detection signal, and the second switch receives an inverted signal of the second detection signal; and
- the first switch and the second switch control whether the second oscillator outputs the plurality of second clock output signals according to the second detection signal.

* * * * *